US009935424B2

(12) United States Patent
Zheng et al.

(10) Patent No.: US 9,935,424 B2
(45) Date of Patent: Apr. 3, 2018

(54) INTEGRATED LASER WITH BACK-REFLECTION ISOLATOR

(71) Applicant: Oracle International Corporation, Redwood City, CA (US)

(72) Inventors: Xuezhe Zheng, San Diego, CA (US); Ashok V. Krishnamoorthy, San Diego, CA (US); Kannan Raj, San Diego, CA (US)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 0 days.

(21) Appl. No.: 14/821,453

(22) Filed: Aug. 7, 2015

(65) Prior Publication Data

US 2016/0294155 A1 Oct. 6, 2016

Related U.S. Application Data

(60) Provisional application No. 62/141,721, filed on Apr. 1, 2015, provisional application No. 62/142,332, filed on Apr. 2, 2015.

(51) Int. Cl.

| | |
|---|---|
| ***H01S 5/026*** | (2006.01) |
| ***H01S 5/022*** | (2006.01) |
| ***H01S 5/02*** | (2006.01) |
| ***G02B 6/42*** | (2006.01) |
| ***G02B 6/12*** | (2006.01) |
| ***G02B 6/124*** | (2006.01) |
| *H01S 5/18* | (2006.01) |

(52) U.S. Cl.

CPC ............ *H01S 5/0228* (2013.01); *G02B 6/124* (2013.01); *G02B 6/12004* (2013.01); *G02B 6/42* (2013.01); *H01S 5/021* (2013.01); *H01S 5/026* (2013.01); *H01S 5/0267* (2013.01); *G02B 6/4208* (2013.01); *H01L 2224/48091* (2013.01); *H01S 5/0268* (2013.01); *H01S 5/18* (2013.01)

(58) Field of Classification Search

CPC .... H01S 5/021; H01S 5/0228–5/02296; H01S 5/0267; H01S 5/0268

See application file for complete search history.

(56) References Cited

U.S. PATENT DOCUMENTS 6,275,317 B1 * 8/2001 Doerr .................. H04B 10/505 398/183
8,660,391 B1 2/2014 Fish
(Continued)

FOREIGN PATENT DOCUMENTS

WO 2009048773 A1 4/2009
WO 2016011002 A1 1/2016

*Primary Examiner* — Tod T Van Roy
(74) *Attorney, Agent, or Firm* — Park, Vaughn, Fleming & Dowler LLP

(57) ABSTRACT

An integrated circuit includes an optical source (such as a laser) with a lens, which is disposed on an isolator. This isolator is disposed on a semiconductor layer in a silicon-on-insulator (SOI) platform that includes an optical coupler and an optical waveguide. During operation, the optical source generates an optical signal that propagates toward the isolator so that the lens focuses the optical signal. Furthermore, the isolator reduces or eliminates back reflection of the optical signal toward the optical source, and the optical coupler couples the optical signal into the optical waveguide.

20 Claims, 4 Drawing Sheets

(56) References Cited

U.S. PATENT DOCUMENTS

| | | | | |
|---|---|---|---|---|
| 2010/0006784 | A1 | 1/2010 | Mack | |
| 2012/0020381 | A1* | 1/2012 | Ishizaka | H01S 5/06804 372/38.02 |
| 2014/0029641 | A1* | 1/2014 | Volodin | G02B 27/0944 372/102 |
| 2014/0133511 | A1* | 5/2014 | Tanaka | H01S 5/0687 372/50.11 |
| 2014/0153605 | A1* | 6/2014 | Arimoto | H01S 5/0267 372/50.11 |

* cited by examiner

INTEGRATED LASER WITH BACK-REFLECTION ISOLATOR

CROSS REFERENCE TO RELATED APPLICATIONS

This application claims priority under 35 U.S.C. § 119(e) to: U.S. Provisional Application Ser. No. 62/141,721, entitled "Integrated Surface-Normal Coupled Array Laser Sources (SCALS) for Si Photonic Circuits," by Xuezhe Zheng, Ashok V. Krishnamoorthy and Kannan Raj, filed on Apr. 1, 2015; and U.S. Provisional Application Ser. No. 62/142,332, entitled "Integrated Surface-Normal Coupled Array Laser Sources (SCALS) for Si Photonic Circuits," by Xuezhe Zheng, Ashok V. Krishnamoorthy and Kannan Raj, filed on Apr. 2, 2015, the contents of both of which are herein incorporated by reference.

GOVERNMENT LICENSE RIGHTS

This invention was made with U.S. Government support under Agreement No. HR0011-08-9-0001 awarded by DARPA. The U.S. Government has certain rights in the invention.

BACKGROUND

Field

The present disclosure relates to techniques for optically coupling an optical signal. More specifically, the present disclosure relates to a lens-integrated vertical laser that optically couples an optical signal into an optical waveguide using a grating coupler, and that includes an isolator to reduce or eliminate back reflection.

Related Art

Advances in CMOS technologies are enabling integrated circuits with very large-scale integration of billions of transistors on a single chip. However, because of thermal constraints and other physical limits, the performance scaling of such large-scale integrated circuits may not be associated with increased clock rates. Instead, parallel architectures that aggregate large numbers of function units are increasingly being used to scale the capabilities of integrated circuits. With more and more processing power being integrated onto a semiconductor chip, integrated circuits often need commensurate increases in the communication bandwidth to fully utilize the increased processing performance.

In particular, over the last decade the off-chip input/output (I/O) bandwidth of advanced processors has increased at a rate of about 2× every two years. Consequently, a total I/O bandwidth of a few Tbps is fairly common for current chips. However, in order to maintain this growth rate, an I/O bandwidth of tens of Tbps may soon be needed for a single chip. Similar communication bandwidth scaling is also occurring at the server level and networking level. Given the limited physical resources, interconnect solutions with lower power consumption, larger bandwidth, and larger bandwidth density are, therefore, needed to meet the communication bandwidth scaling demand of high-performance electrical systems.

Silicon photonics is a promising technology that can provide efficient and dense large bandwidth system interconnects for future computing systems. Significant progress has been made toward achieving low-cost practical applications, including components such as: high-bandwidth efficient silicon modulators, low-loss optical waveguides, wavelength division multiplexing (WDM) components, as well as high-speed CMOS optical waveguide photo-detectors. However, low-cost and reliable array laser sources integrated with silicon photonics remain an obstacle to implementing large-scale integrated silicon photonic links While individual external III-V laser sources are commercially available, low-cost integration of an array of external laser sources onto a silicon photonics chip remains a challenge. In principle, an optical fiber array can be used to bring many-channel laser sources onto silicon photonics chips. However, in practice this approach is prohibitively expensive.

A variety of approaches are being investigated to make integrated laser source arrays. For example, an electrical pumped distributed feedback laser has been demonstrated by heterogeneous integration of III-V materials on silicon. However, the yield and reliability of this distributed feedback laser remain obstacles to low-cost optical sources. Moreover, III-V materials and processes are usually not defect-free. Consequently, the yield of III-V lasers remains much lower compared to silicon CMOS circuits. Furthermore, burn-in is also typically required to weed out the infant failures. Therefore, it is not typically ideal to integrate III-V lasers with silicon photonics circuits before component qualification, especially for applications such as large bandwidth system interconnects in which large integration scale is typically required.

Another approach uses a single high-power laser source packaged with free-space optics supported by a silicon bench for integration with silicon photonics chips. This approach may allow power sharing so that multiple optical links can be supported in parallel. However, the scaling of such an optical source is often limited given the limited maximum power of an individual laser die. Moreover, integration of many laser packages onto a single silicon photonics chip may be needed for large bandwidth system interconnects, such as applications with tens and hundreds of optical links, which represents a significant challenge for packaging and integration.

Hence, what is needed is an optical source without the above-described problems.

SUMMARY

One embodiment of the present disclosure provides an integrated circuit. This integrated circuit includes: a substrate; a buried-oxide (BOX) layer disposed on the substrate; and a semiconductor layer disposed on the BOX layer, where the semiconductor layer includes an optical coupler and an optical waveguide. Moreover, the integrated circuit includes: an isolator disposed on the semiconductor layer; and an optical source, disposed on the isolator, which includes a lens. During operation, the optical source generates an optical signal that propagates toward the isolator so that the lens focuses the optical signal. Furthermore, during operation the isolator reduces back reflection of the optical signal toward the optical source, and the optical coupler couples the optical signal into the optical waveguide.

Note that the optical coupler may include a grating coupler and/or the optical source may include a laser.

Moreover, the isolator may include: a half-wave plate that, during operation, produces a $\pi$ phase shift between the polarization components along its ordinary axis and extraordinary axis in the optical signal; a Faraday rotator; and a polarizer. The polarizer may be aligned with the optical source so that a polarization of the optical signal propagating from the optical source towards the optical coupler passes through the polarizer. Furthermore, the Faraday rotator may produce a 45° rotation to the plane of the polarized optical signal. Note that the Faraday rotator may be disposed on the polarizer, and the half-wave plate may be disposed on the Faraday rotator. In some embodiments, the optical axis of the half-wave plate is set to 67.5° relative to the original polarization plane of the optical signal if the polarizer is aligned to the transverse magnetic (TM) mode of the optical signal, or 22.5° relative to the original polarization plane of the optical signal if the polarizer is aligned to the transverse electric (TE) mode of the optical signal, such that the polarization of the optical signal after the half-wave plate is aligned to the TE mode of the optical waveguide.

Additionally, the optical source may generate the optical signal in a plane and a mirror may reflect the optical signal at an angle relative to the plane. This angle may be other than 90°.

In some embodiments, the lens is offset in a horizontal direction from a location of the optical coupler so that, during operation, the optical signal propagates through the isolator to the optical coupler.

Moreover, the integrated circuit may include an array of optical sources disposed on the isolator. For example, the array of sources may include an array of lasers having different wavelengths having a fixed spacing so as to define a wavelength division multiplexing (WDM) wavelength grid.

Another embodiment provides a system that includes: a processor; a memory that stores a program module; and the integrated circuit. During operation, the program module is executed by the processor.

Another embodiment provides a method for optically coupling an optical signal into an optical waveguide, which may be performed by the integrated circuit.

This Summary is provided merely for purposes of illustrating some exemplary embodiments, so as to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

Embodiments of an integrated circuit that includes an optical source, a system that includes the integrated circuit, and a method for optically coupling an optical signal into an optical waveguide are described. The integrated circuit includes an optical source (such as a laser) and a lens, which is disposed on an isolator. Moreover, the isolator is disposed on a semiconductor layer in a silicon-on-insulator (SOI) platform that includes an optical coupler and an optical waveguide. During operation, the optical source generates an optical signal so that the optical signal propagates toward the isolator, and the lens focuses the optical signal. Furthermore, the isolator reduces or eliminates back reflection of the optical signal toward the optical source, and the optical coupler couples the optical signal into the optical waveguide.

This optical integration technique may facilitate low-cost and high yield integration of a surface-normal coupled array laser source (SCALS) with a silicon photonics circuit. In particular, the integrated isolator in the integrated circuit may allow the integrated circuit to reduce or eliminate back reflections from the optical coupler (such as a grating coupler). In addition, the use of a planar configuration or architecture may enable wafer-scale processing, assembly, integration and testing, which can provide a reliable low-cost laser source for large-scale silicon photonics integration. Consequently, the optical integration technique may facilitate silicon photonic links for use in applications such as wavelength-division multiplexing.

Figure 1:
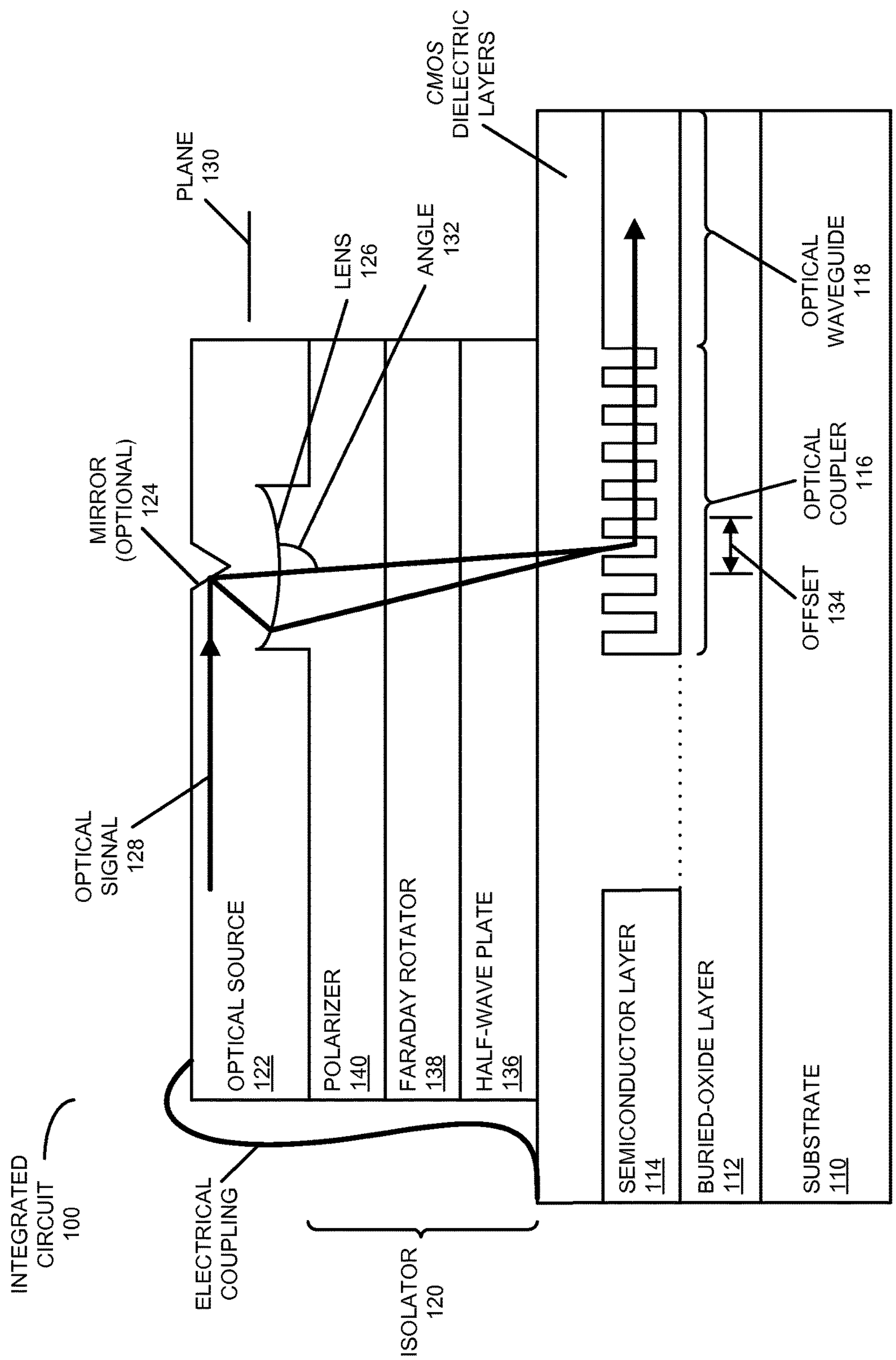
FIG. 1 is a block diagram illustrating a side view of an integrated circuit that includes an optical source in accordance with an embodiment of the present disclosure.

We now describe embodiments of the integrated circuit (such as a photonics integrated circuit). FIG. 1 presents a block diagram illustrating a side view of an integrated circuit 100 that includes an optical source 122. This integrated circuit includes: a substrate 110; a buried-oxide (BOX) layer 112 disposed on substrate 110; and a semiconductor layer 114 disposed on BOX layer 112, where semiconductor layer 114 (and optionally BOX layer 112) include an optical coupler 116 and an optical waveguide 118. For example, substrate 110 and semiconductor layer 114 may include silicon, and buried-oxide layer 112 may include silicon dioxide. Thus, substrate 110, buried-oxide layer 112 and semiconductor layer 114 may constitute a silicon-on-insulator (SOI) technology.

Moreover, integrated circuit 100 may include: an isolator 120 disposed on semiconductor layer 114; and optical source 122 (such as a laser), disposed on isolator 120. Note that optical source 122 may include an optional mirror 124 and a lens 126. Thus, optical source 122 may include a so-called 'lens-integrated laser.' In addition, note that optical source 122 may receive power from electrical circuits integrated on substrate 110.

During operation, optical source 122 generates an optical signal 128 so that optical signal 128 propagates toward isolator 120, and lens 126 focuses optical signal 128. For example, optical source 122 may include a vertical-cavity surface-emitting laser (VCSEL). Alternatively or additionally, optical source 122 may generate optical signal 128 in a plane 130, and optional mirror 124 may reflect optical signal 128 at an angle 132 relative to plane 130.

Furthermore, during operation, isolator 120 reduces back reflection of optical signal 128 toward optical source 122, and optical coupler 116 couples optical signal 128 into optical waveguide 118. For example, optical coupler 116 may include a grating coupler. (However, other types of optical couplers may be used.) Because grating couplers have incidence angles other than 90°, angle 132 may be other than 90°. Furthermore, because isolator 120 may have a finite thickness, lens 126 may be offset 134 in a horizontal direction in plane 130 from a location of optical coupler 116 so that, during operation, optical signal 128 propagates through isolator 120 to optical coupler 116.

In some embodiments, isolator 120 includes: a half-wave plate 136 that, during operation, produces a π phase shift between the polarization components along its ordinary axis and extraordinary axis in optical signal 128; a Faraday rotator 138 (or, more generally, another type of non-reciprocal rotator); and a polarizer 140. Because optical signal 128 generated by optical source 122 may be polarized, polarizer 140 may be aligned with optical source 122 so that the polarization of optical signal 128 (including the phase shifts associated with preceding layers in isolator 120) passes through polarizer 140. Furthermore, Faraday rotator 138 may produce a 45° rotation to the plane of polarized optical signal 128. As shown in FIG. 1, note that Faraday rotator 138 may be disposed on polarizer 140, and half-wave plate 136 may be disposed on Faraday rotator 138. However, in other embodiments, the order of at least some of these layers may be changed.

In some embodiments, the optical axis of half-wave plate 136 is set to 67.5° relative to the original polarization plane of optical signal 128 if polarizer 140 is aligned to the transverse magnetic (TM) mode of optical signal 128, or 22.5° relative to the original polarization plane of optical signal 128 if polarizer 140 is aligned to the transverse electric (TE) mode of optical signal 128, such that the polarization of optical signal 128 after half-wave plate 136 is aligned to the TE mode of optical waveguide 118. Note that, in theory, the polarization of optical signal 128 after Faraday rotator 138 can be aligned with the TE mode of optical waveguide 118 by rotating the orientation of optical waveguide 118 instead of using half-wave plate 136. However, in practice routing off a Manhattan grid is generally not encouraged.

We now further describe exemplary embodiments of the integrated circuit. Low-loss coupling is typically important for successful integration of a III-V external laser source with silicon photonics circuits. There are several ways to couple light onto a silicon photonics chip, including: edge coupling, evanescent coupling, and surface-normal coupling via a grating coupler. Silicon grating couplers can seamlessly transform a sub-micron SOI optical waveguide mode into a much larger optical mode (such as an approximately 10 μm optical mode of a single-mode optical fiber), which can significantly relax the alignment tolerances for optical coupling. Surface-normal coupling can also make two-dimensional (2D) array integration possible, which is often desirable for large-scale integration. In addition, surface-normal coupling may enable wafer-scale testing for low-cost manufacturing. Consequently, grating-coupler based surface-normal coupling may provide improved manufacturability.

However, direct surface-normal coupling of III-V lasers with silicon photonics chips is usually not straightforward because most III-V lasers are edge-emitting devices. Therefore, surface-normal emitting III-V lasers with optical mode sizes that match the silicon grating coupler may be needed for low-loss integration with silicon photonics circuits. One option in this regard is a lens-integrated surface-emitting laser. Using either wet- or dry-etch processes, a facet mirror can be created to reflect the output of an edge-emitting laser toward its substrate. A lens fabricated on the other side of the substrate using techniques such as photoresist reflow or gray-scale mask may then collimate or focus the laser output beam for coupling with other photonic circuits. Typically, the facet mirror is made to be 45° so that the lens-integrated laser has perfect surface-normal output (i.e., at 90° relative to a plane of the lens-integrated-laser substrate).

In order to integrate a lens-integrated surface-emitting laser onto a silicon photonic chip via grating couplers, a few modifications may be needed to enable correct operation. In particular, silicon grating couplers usually have a coupling angle a few degrees to the surface-normal. Consequently, in order to match the coupling angle on the laser side, a facet mirror angle different from 45° and/or a horizontal shift of the lens center relative to the reflecting point of the laser may be used.

Moreover, III-V lasers are typically sensitive to external back reflections. However, it can be difficult to eliminate back reflection for silicon grating couplers. In particular, a −15 to −20 dB back reflection may occur with silicon grating couplers. In order to minimize the impact of grating back reflection on the performance of a III-V laser, an isolator may be used. As shown in FIG. 1, a single-channel integrated SCAL may include a 3-layer free-space isolator. The isolator may include: a polarizer (such as a polarizer plate) with polarization aligned with the laser output; a magnet-free Faraday rotator that rotates the polarization of the input optical beam or signal by 45°; and a half-wave plate that rotates the optical beam polarization back to be aligned with the TE polarization of the silicon optical waveguide(s). Because of the non-reciprocal nature of the Faraday rotator, the back-reflection optical beam from the grating couplers may have a polarization orthogonal to the polarization of the polarizer. Consequently, the back-reflection optical beam may be blocked before entering the lens-integrated laser. Note that in some embodiments the polarizer plate may be excluded when the III-V laser optical waveguide is designed with a large enough discrimination between the TE and the TM modes.

Furthermore, in order to match the grating-coupler optical mode, a thickness of the III-V laser substrate (e.g., approximately 150 μm) and the focal length of the back-side lens (e.g., approximately 90 μm) may be selected to focus the output beam a few microns below the bottom surface of the half-wave plate.

Additionally, the lasing optical waveguide structure in the lens-integrated laser and the grating-coupler optical mode may be predetermined to maximize mode-overlap. In particular, the output of the lasing optical waveguide structure and the input facet of the grating coupler may form respective image conjugates of the lens. The lens position and magnification may be selected to match the image of the laser output to the optical mode size of the grating coupler.

While FIG. 1 illustrates a single laser, in general a one-dimensional (1D) or 2D array of lens-integrated lasers can be integrated in the integrated circuit with a shared or common polarizer, a magnet-free Faraday rotator and a half-wave plate to form a 1D or 2D integrated SCALS. This SCALS can then be aligned and bonded onto a silicon photonics chip that has a grating-coupler array with matching pitches. Moreover, wire bonding can be used to electrically connect the SCALS with the silicon photonics chip. For example, there may be an array of optical sources disposed on the isolator. In some embodiments, the array of sources includes an array of lasers having different wavelengths having a fixed spacing so as to define a wavelength division multiplexing (WDM) wavelength grid.

Because the polarizer, the Faraday rotator and the half-wave plate may be planar devices shared by the lasers in the array, additional alignment may not be needed. Moreover, the lasers, facet mirrors, and back-side mirrors may be lithographically defined. Consequently, the assembly, integration, and testing of the SCALS can, in principle, be performed at wafer scale, thereby reducing the cost of the integrated circuit.

In some embodiments, the one or more lasers used for SCALS can be distributed feedback lasers having the same or different carrier wavelengths (the latter may facilitate a wavelength-division-multiplexing SCALS). Note that with lithography defined array-position accuracy, SCALS can be scaled in array size without suffering from accumulated misalignments that often occur with other array integration approaches. This scalability may facilitate large-scale silicon photonics integration.

Additionally, in some embodiments the isolator is integrated with the lens-integrated laser and then the combination is integrated with a remainder of the integrated circuit. This approach may allow the remainder of the integrated circuit to undergo reflow processing prior to integration with the lens-integrated laser and the isolator, which may prevent the isolator from being damaged during the reflow processing.

In an exemplary embodiment, semiconductor layer 114 may have a thickness that is less than 1 μm (such as 0.2-3 μm). Furthermore, buried-oxide layer 112 may have a thickness between 0.3 and 3 μm (such as 0.8 μm). Note that a width of the optical waveguide in integrated circuit 100 may be 0.5-3 μm. In an exemplary embodiment, the optical waveguide conveys optical signal 128 (i.e., light) having wavelengths between 1.1-1.7 μm, such as optical signal 128 having a fundamental wavelength of 1.3 or 1.55 μm.

Figure 2:
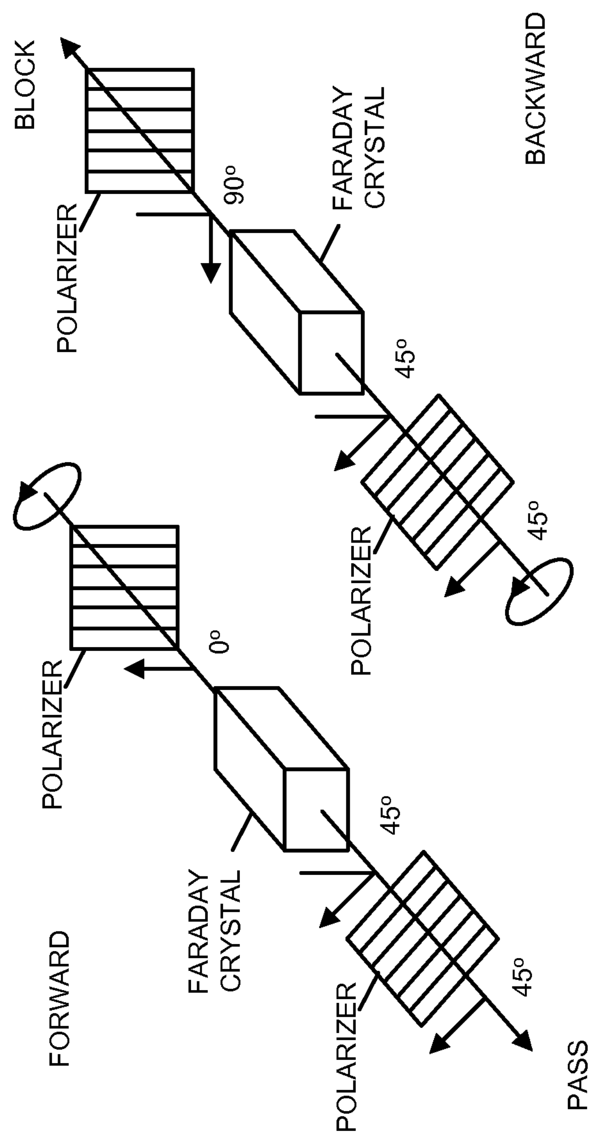
FIG. 2 is a drawing illustrating an isolator in the integrated circuit of FIG. 1 in accordance with an embodiment of the present disclosure.

In some embodiments, isolator 120 is a magnet-free optical isolator that is implemented using a Faraday rotator sandwiched between a pair of polarizers with their polarization orientation set to 45° relative to each other. This is shown in FIG. 2, which presents a drawing illustrating isolator 120 in integrated circuit 100 (FIG. 1). Note that the Faraday rotator may include magnetized rare-earth iron garnet (RIG) crystals in which the polarization plane of the light is rotated when the light pass through the material. Moreover, the coercive force (Hc) of the magnet-free Faraday crystals may range from a few hundred to a couple thousand Oersted. Furthermore, the thickness of the Faraday crystal in isolator 120 may be chosen such that it rotates the polarization plane of the light 45°. For example, for a RIG material with Hc of 500 Oe, the thickness may be about 420 μm for 45° polarization rotation for light at wavelength of 1550 nm. Using a nanoparticle linear film or a polymer film, the linear polarizers can be fabricated on a thin glass substrate, e.g., with a thickness of 0.2 to 2 mm.

Note that for coupling of laser light into a silicon optical waveguide on thin SOI the second polarizer may not be necessary because the silicon optical waveguide with the slab on thin SOI typically only supports TE polarization. In order to match the silicon optical waveguide TE mode with the rotated polarization after the Faraday rotator, a half-wave plate can be used with its fast axis set to 22.5° relative to the polarization plane after the Faraday rotator instead of the second polarizer. This layout may be more convenient. Moreover, the thickness of the half-wave plate can be small when a zero-order half-wave plate is used, e.g., a thickness of around 90 μm.

Figure 3:
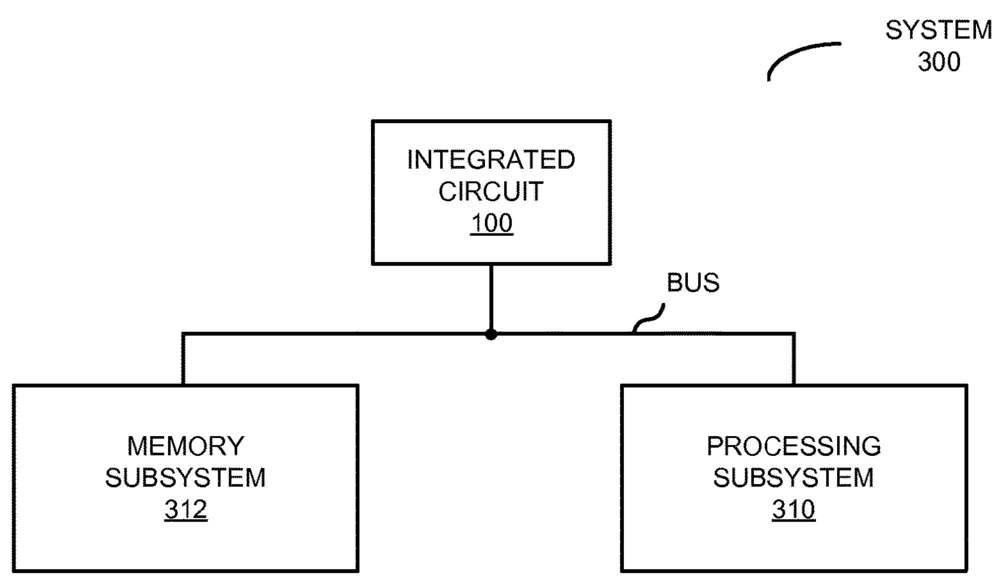
FIG. 3 is a block diagram illustrating a system that includes the integrated circuit of FIG. 1 in accordance with an embodiment of the present disclosure.

Integrated circuit 100 (FIG. 1) may be included in a system and/or an electronic device. This is shown in FIG. 3, which presents a block diagram illustrating a system 300 that includes integrated circuit 100. In some embodiments, system 300 includes processing subsystem 310 (with one or more processors) and memory subsystem 312 (with memory).

In general, functions of integrated circuit 100 and system 300 may be implemented in hardware and/or in software. Thus, system 300 may include one or more program modules or sets of instructions stored in a memory subsystem 312 (such as DRAM or another type of volatile or non-volatile computer-readable memory), which, during operation, may be executed by a processing subsystem 310. Note that the one or more computer programs may constitute a computer-program mechanism. Furthermore, instructions in the various modules in memory subsystem 312 may be implemented in: a high-level procedural language, an object-oriented programming language, and/or in an assembly or machine language. Note that the programming language may be compiled or interpreted, e.g., configurable or configured, to be executed by the processing subsystem.

Components in system 300 may be coupled by signal lines, links or buses. These connections may include electrical, optical, or electro-optical communication of signals and/or data. Furthermore, in the preceding embodiments, some components are shown directly connected to one another, while others are shown connected via intermediate components. In each instance, the method of interconnection, or 'coupling,' establishes some desired communication between two or more circuit nodes, or terminals. Such coupling may often be accomplished using a number of circuit configurations, as will be understood by those of skill in the art; for example, AC coupling and/or DC coupling may be used.

In some embodiments, functionality in these circuits, components and devices may be implemented in one or more: application-specific integrated circuits (ASICs), field-programmable gate arrays (FPGAs), and/or one or more digital signal processors (DSPs). Furthermore, functionality in the preceding embodiments may be implemented more in hardware and less in software, or less in hardware and more in software, as is known in the art. In general, system 300 may be at one location or may be distributed over multiple, geographically dispersed locations.

System 300 may include: a VLSI circuit, a switch, a hub, a bridge, a router, a communication system (such as a wavelength-division-multiplexing communication system), a storage area network, a data center, a network (such as a local area network), and/or a computer system (such as a multiple-core processor computer system). Furthermore, the computer system may include, but is not limited to: a server (such as a multi-socket, multi-rack server), a laptop computer, a communication device or system, a personal computer, a work station, a mainframe computer, a blade, an enterprise computer, a data center, a tablet computer, a supercomputer, a network-attached-storage (NAS) system, a storage-area-network (SAN) system, a media player (such as an MP3 player), an appliance, a subnotebook/netbook, a tablet computer, a smartphone, a cellular telephone, a network appliance, a set-top box, a personal digital assistant (PDA), a toy, a controller, a digital signal processor, a game console, a device controller, a computational engine within an appliance, a consumer-electronic device, a portable computing device or a portable electronic device, a personal organizer, and/or another electronic device. Note that a given computer system may be at one location or may be distributed over multiple, geographically dispersed locations.

Moreover, integrated circuit 100 can be used in a wide variety of applications, such as: optical communications (for example, in a transceiver, an optical interconnect or an optical link, such as for intra-chip or inter-chip communication), a radio-frequency filter, a bio-sensor, data storage (such as an optical-storage device or system), medicine (such as a diagnostic technique or surgery), a barcode scanner, and/or metrology (such as precision measurements of distance).

Furthermore, the embodiments of the optical source, integrated circuit 100 and/or system 300 may include fewer components or additional components. Although these embodiments are illustrated as having a number of discrete items, these optical components, integrated circuits and the system are intended to be functional descriptions of the various features that may be present rather than structural schematics of the embodiments described herein. Consequently, in these embodiments two or more components may be combined into a single component, and/or a position of one or more components may be changed. In addition, functionality in the preceding embodiments of the optical source, integrated circuit 100 and/or system 300 may be implemented more in hardware and less in software, or less in hardware and more in software, as is known in the art.

While the preceding embodiments have been illustrated with particular elements and compounds, a wide variety of materials and compositions (including stoichiometric and non-stoichiometric compositions) may be used, as is known to one of skill in the art. Thus, while a silicon optical waveguide was illustrated in the preceding embodiments, the optical integration technique may be used with other materials (such as germanium and/or silicon germanium), as is known to one of skill in the art. Moreover, the semiconductor layer may include polysilicon or amorphous silicon. Furthermore, the materials and compounds in integrated circuit 100 may be fabricated using a wide variety of processing techniques, including: evaporation, sputtering, molecular-beam epitaxy, wet or dry etching (such as photolithography or direct-write lithography), polishing, etc. In addition, a wide variety of optical components may be used in or in conjunction with the optical source and/or integrated circuit 100. Furthermore, a wide variety of optical sources may be integrated or included in integrated circuit 100, including many different types of lasers or non-laser optical sources (such as a light emitting diode).

Figure 4:
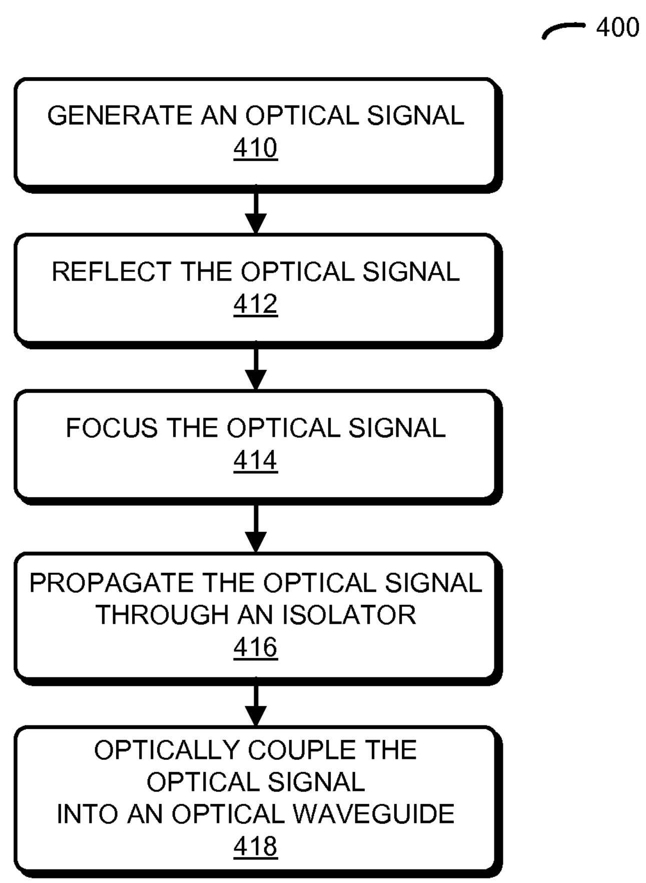
FIG. 4 is a flow chart illustrating a method for optically coupling an optical signal into an optical waveguide in accordance with an embodiment of the present disclosure.

We now describe embodiments of a method. FIG. 4 presents a flow chart illustrating a method 400 for optically coupling an optical signal into an optical waveguide, which may be performed by an integrated circuit (such as integrated circuit 100 in FIG. 1). During operation, an optical source in the integrated circuit generates the optical signal (operation 410) in a plane of the optical source. Then, a mirror in the optical source reflects the optical signal (operation 412) at an angle relative to the plane, and a lens in the optical source focuses the optical signal (operation 414) on an optical coupler. Moreover, the optical signal propagates through an isolator (operation 416) that reduces back reflection of the optical signal toward the optical source, where the optical source is disposed on the isolator. Next, an optical coupler in the integrated circuit optically couples the optical signal into the optical waveguide (operation 418) in the integrated circuit, where the isolator is disposed on a semiconductor layer that includes the optical coupler and the optical waveguide, the semiconductor layer is disposed on a buried-oxide (BOX) layer, and the BOX layer is disposed on a substrate.

In some embodiments of method 400, there may be additional or fewer operations. Moreover, the order of the operations may be changed, and/or two or more operations may be combined into a single operation.

The optical source and the integrated circuit may be used in a wide variety of applications, such as: communications, manufacturing (cutting or welding), a lithographic process, data storage (such as an optical-storage device or system), medicine (such as a diagnostic technique or surgery), a barcode scanner, entertainment (a laser light show), and/or metrology (such as precision measurements of distance).

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. An integrated circuit, comprising:

a substrate;

a buried-oxide (BOX) layer disposed on the substrate;

a semiconductor layer disposed on the BOX layer, wherein the semiconductor layer includes an optical coupler and an optical waveguide, and wherein, during operation, the optical coupler couples an optical signal into the optical waveguide;

an isolator disposed on the semiconductor layer, wherein the isolator comprises a half-wave plate; and an optical source, disposed on the isolator, which includes a lens, wherein an output of the optical source and an input facet of the optical coupler form respective image conjugates of the lens, wherein a position of the lens and a magnification of the lens is selected to match an image of the optical source to an optical mode size of the optical coupler, and wherein, during operation, the optical source generates the optical signal that propagates toward the isolator, and the lens focuses the optical signal a few microns below a bottom surface of the half-wave plate; and wherein, during operation, the isolator reduces back reflection of the optical signal toward the optical source.

2. The integrated circuit of claim 1, wherein the optical coupler includes a grating coupler.

3. The integrated circuit of claim 1, wherein the isolator includes:

the half-wave plate that, during operation, produces a $\pi$ phase shift between polarization components along an ordinary axis and extraordinary axis in the optical signal and that rotates a polarization plane of the optical signal by twice an angle between an optical axis of the half-wave plate and an input polarization of the optical signal;

a Faraday rotator; and a polarizer.

4. The integrated circuit of claim 3, wherein the polarizer is aligned with the optical source so that a polarization of the optical signal propagating from the optical source toward the optical coupler passes through the polarizer.

5. The integrated circuit of claim 3, wherein the polarizer is aligned with the half-wave plate.

6. The integrated circuit of claim 3, wherein the Faraday rotator produces a 45° phase shift between the horizontal and the vertical polarization components in the optical signal.

7. The integrated circuit of claim 3, wherein the Faraday rotator is disposed on the polarizer, and the half-wave plate is disposed on the Faraday rotator.

8. The integrated circuit of claim 1, wherein the optical source generates the optical signal in a plane and a mirror in the optical source reflects the optical signal at an angle relative to the plane; and wherein the angle is other than 90°.

9. The integrated circuit of claim 1, wherein the lens is offset in a horizontal direction from a location of the optical coupler so that, during operation, the optical signal propagates through the isolator to the optical coupler.

10. The integrated circuit of claim 1, wherein the optical source includes a laser.

11. A system, comprising:

a processor;

a memory, coupled to the processor, that stores a program module, which, during operation, is executed by the processor; and an integrated circuit, wherein the integrated circuit includes:

a substrate;

a buried-oxide (BOX) layer disposed on the substrate;

a semiconductor layer disposed on the BOX layer, wherein the semiconductor layer includes an optical coupler and an optical waveguide, and wherein, during operation, the optical coupler couples an optical signal into the optical waveguide;

an isolator disposed on the semiconductor layer, wherein the isolator comprises a half-wave plate; and an optical source, disposed on the isolator, which includes a lens, wherein an output of the optical source and an input facet of the optical coupler form respective image conjugates of the lens, wherein a position of the lens and a magnification of the lens is selected to match an image of the optical source to an optical mode size of the optical coupler, and wherein, during operation, the optical source generates the optical that propagates toward the isolator, and the lens focuses the optical signal a few microns below a bottom surface of the half-wave plate; and wherein, during operation, the isolator reduces back reflection of the optical signal toward the optical source.

12. The system of claim 11, wherein the optical coupler includes a grating coupler.

13. The system of claim 11, wherein the isolator includes:

the half-wave plate that, during operation, produces a $\pi$ phase shift between polarization components along an ordinary axis and extraordinary axis in the optical signal and that rotates a polarization plane of the optical signal by twice an angle between an optical axis of the half-wave plate and an input polarization of the optical signal;

a Faraday rotator; and a polarizer.

14. The system of claim 13, wherein the polarizer is aligned with the optical source so that a polarization of the optical signal propagating from the optical source toward the optical coupler passes through the polarizer.

15. The system of claim 13, wherein the polarizer is aligned with the half-wave plate.

16. The system of claim 13, wherein the Faraday rotator produces a 45° phase shift between the horizontal and the vertical polarization components in the optical signal.

17. The system of claim 13, wherein the Faraday rotator is disposed on the polarizer, and the half-wave plate is disposed on the Faraday rotator.

18. The system of claim 11, wherein the optical source generates the optical signal in a plane and a mirror in the optical source reflects the optical signal at an angle relative to the plane; and wherein the angle is other than 90°.

19. The system of claim 11, wherein the lens is offset in a horizontal direction from a location of the optical coupler so that, during operation, the optical signal propagates through the isolator to the optical coupler.

20. A method for optically coupling an optical signal into an optical waveguide, comprising:

generating the optical signal in a plane of an optical source, wherein the optical source includes a lens;

reflecting the optical signal at an angle relative to the plane using a mirror;

focusing the optical signal a few microns below a bottom surface of a half-wave plate;

propagating the optical signal through an isolator that reduces back reflection of the optical signal toward the optical source, wherein the optical source is disposed on the isolator, wherein the isolator comprises the half-wave plate; and optically coupling the optical signal into the optical waveguide using an optical coupler, wherein the isolator is disposed on a semiconductor layer that includes the optical coupler and the optical waveguide, wherein an output of the optical source and an input facet of the optical coupler form respective image conjugates of the lens, wherein a position of the lens and a magnification of the lens is selected to match an image of the optical source to an optical mode size of the optical coupler;

wherein the semiconductor layer is disposed on a buried-oxide (BOX) layer; and wherein the BOX layer is disposed on a substrate.

* * * * *

UNITED STATES PATENT AND TRADEMARK OFFICE

CERTIFICATE OF CORRECTION

PATENT NO. : 9,935,424 B2
APPLICATION NO. : 14/821453
DATED : April 3, 2018
INVENTOR(S) : Zheng et al.

It is certified that error appears in the above-identified patent and that said Letters Patent is hereby corrected as shown below:

On the Title Page

Column 2, under Attorney Agent, or Firm, Line 1, delete “Vaughn,” and insert -- Vaughan, --, therefor.

In the Specification

In Column 2, Line 4, after “links” insert -- . --.

In Column 6, Line 19, delete “SCAL” and insert -- SCALS --, therefor.

Signed and Sealed this
Fourth Day of December, 2018

Andrei Iancu
*Director of the United States Patent and Trademark Office*